US011705171B2

United States Patent

(12) United States Patent
Kumar et al.
(10) Patent No.: US 11,705,171 B2
(45) Date of Patent: Jul. 18, 2023

(54) SWITCHED CAPACITOR MULTIPLIER FOR COMPUTE IN-MEMORY APPLICATIONS

(71) Applicant: Intel Corporation, Santa Clara, CA (US)

(72) Inventors: Ashish Kumar, Ghaziabad (IN); Srikanth Jatavallabhula, Bengaluru (IN)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 17/483,145

(22) Filed: Sep. 23, 2021

(65) Prior Publication Data

US 2022/0013155 A1 Jan. 13, 2022

(51) Int. Cl.
*G11C 7/22* (2006.01)
*G11C 7/14* (2006.01)
*G06N 3/063* (2023.01)

(52) U.S. Cl.
CPC ............ *G11C 7/222* (2013.01); *G06N 3/063* (2013.01); *G11C 7/14* (2013.01)

(58) Field of Classification Search
CPC ......... G11C 7/222; G11C 11/401; G11C 7/14; G11C 11/54; G11C 27/024; G11C 7/1006; G06N 3/063; G06N 3/065
See application file for complete search history.

(56) References Cited

U.S. PATENT DOCUMENTS

2022/0276835 A1* 9/2022 Yang ...................... G11C 11/54
2022/0334801 A1* 10/2022 Wang ..................... G06F 7/523

* cited by examiner

*Primary Examiner* — Ajay Ojha
(74) *Attorney, Agent, or Firm* — Jordan IP Law, LLC

(57) ABSTRACT

Systems, apparatuses and methods include technology that identifies whether a product of first and second digital numbers is associated with a positive value or a negative value. During a first clock phase, the technology sets a first reference voltage to have a first value or a second value based on whether the product is associated with the positive value or the negative value. During the first clock phase, the technology controls switches to supply the first reference voltage to first plates of capacitors. Each of the capacitors includes a respective first plate of the first plates and a second plate. Further, during the first clock phase, the technology controls the switches based on the first digital number to electrically connect at least one of the second plates to the first reference voltage and electrically connect at least one of the second plates to a second reference voltage.

25 Claims, 10 Drawing Sheets

SWITCHED CAPACITOR MULTIPLIER FOR COMPUTE IN-MEMORY APPLICATIONS

TECHNICAL FIELD

Embodiments generally relate to in-memory computing. More particularly, embodiments relate to a capacitor based multiplication process that may be executed in-memory with low latency.

BACKGROUND

Machine learning applications may be highly dependent on algorithms that execute involved and lengthy operations (e.g., convolution involving arithmetic). Furthermore, applications like audio, image recognition, face detection etc. may prefer that such algorithms be executed proximate to the sensor to minimize latency, energy and data transfer overhead. Deep neural networks and powerful algorithms with a reduced number of coefficients have enabled processes to execute with on-chip static random-access memory (SRAM) to achieve a minimum error rate for applications (e.g., audio and image recognition). Arithmetic operations based on data from the on-chip SRAM may incur increased energy costs for computations.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Some embodiments relate to energy and latency efficient in-memory computing to execute arithmetic operations (e.g., operations of a neural network). Neural networks with low-precision may achieve a desirable level of classification accuracy. In some embodiments, computations based on digital inputs and weights may be better achieved with analog circuits as compared to digital circuits in terms of area and energy efficiency. Therefore, some embodiments include a switched capacitor-based multiplication architecture 304 to execute neural network computations and generate an analog output.

The switched capacitor-based multiplication architecture 304 may operate at a reduced latency, greater efficiency, lower energy and with fewer components than other designs. For example, other designs may require five or more clock cycles to complete with more electrical components than the switched capacitor-based multiplication architecture 304. For example, the switched capacitor-based multiplication architecture 304 may not require use of a dedicated digital-to-analog converter (DAC) (that is separate from arithmetic computation units), as is used other implementations. Moreover, the switched capacitor-based multiplication architecture 304 may complete an entire multiplication process in only four clock phases. These clock phases may be generated synchronously or asynchronously with an available clock. Furthermore, the switched capacitor-based multiplication architecture 304 may be nearly, if not completely, offset-free. Furthermore, output voltage of the switched capacitor-based multiplication architecture 304 may be attenuated by the parasitic capacitances present only at one plate of binary capacitors (discussed below) and thus, operate with greater efficiency and signal quality than other designs. As such, a possible signal range for processing is higher as compared to other implementations and benefits in terms of signal-to-noise ratio. Moreover, the switched capacitor-based multiplication architecture 304 may be disposed proximate memory to execute in memory computing operations.

Figure 1:
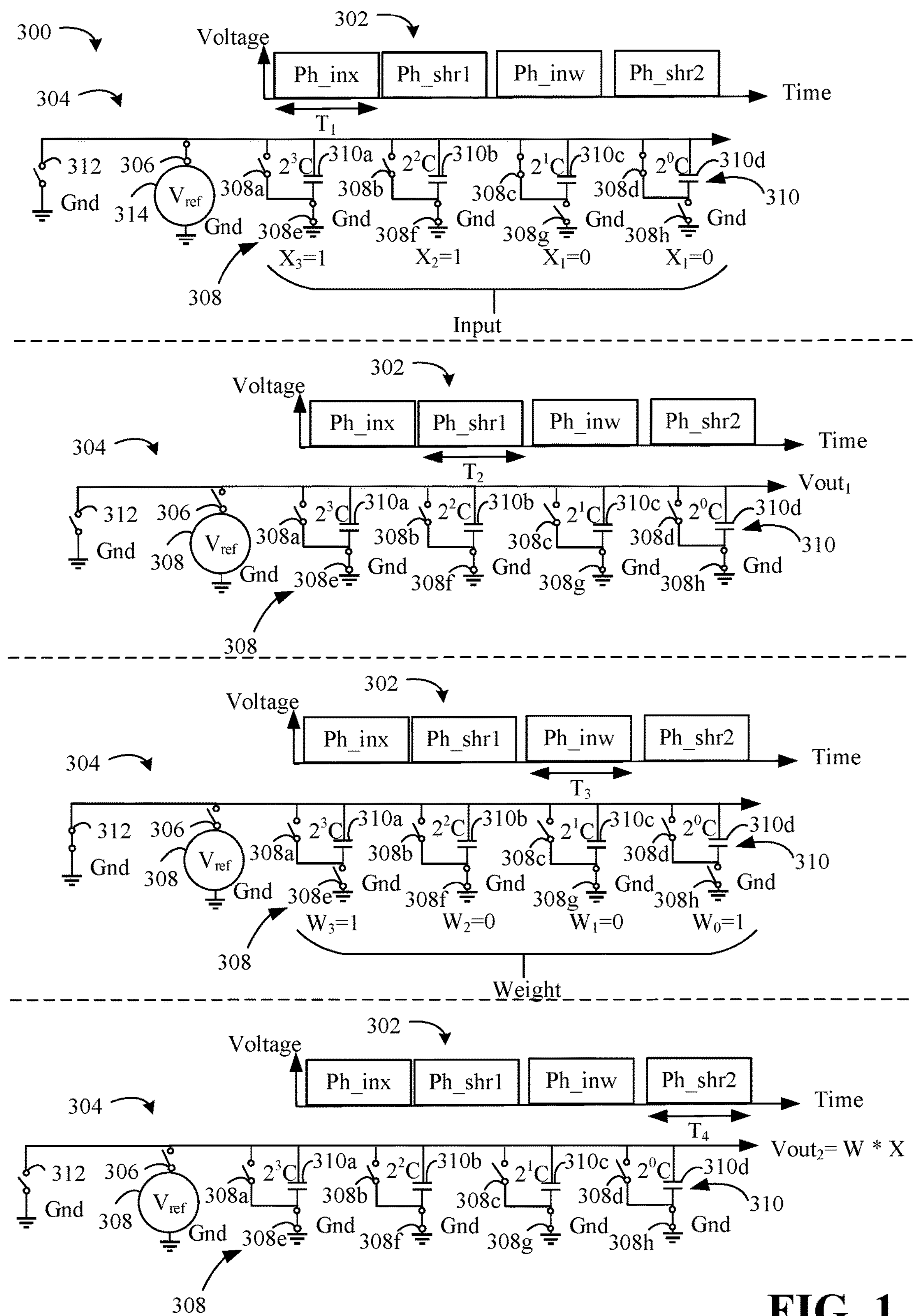
FIG. 1 is a diagram of an example of a multiplication process according to an embodiment.

In detail, in FIG. 1, a multiplication process 300 is illustrated. The multiplication process 300 is illustrated as a single ended implementation for simplicity. It will be understood that a differential implementation may be implemented in a similar way. The multiplication process 300 is a 4-bit multiplication, but it will be understood that more or less bits may be multiplied by adding capacitors as needed (e.g., in a 1 bit to 1 capacitor ratio). Thus, the multiplication process 300 may be extended to a higher number of bits.

Multiplication process 300 includes a timing diagram 302 and the switched capacitor-based multiplication architecture 304. The switched capacitor-based multiplication architecture 304 is adjusted during different time periods of the timing diagram 302 to execute a multiplication operation. For example, a computing device, hardware device, logic (e.g., configurable logic and/or fixed-function logic hardware) or other structure may adjust the switched capacitor-based multiplication architecture 304 to enable a low latency and efficient multiplication operation.

The switched capacitor-based multiplication architecture 304 includes capacitors 310 and switches 308. The switches 308 include first-eighth switches 308*a*-308*h* and the capacitors 310 include first-fourth capacitors 310*a*-310*d*. The process 300 controls the first-eighth switches 308*a*-308*h* to selectively apply electrical signals to the first-fourth capacitors 310*a*-310*d* during different the time periods and/or phases of the timing diagram 302.

The process 300 executes a multiplication operation based on an input (e.g., a first digital number) associated with a layer of a neural network (the input may originate from another switched capacitor-based multiplication architecture) and a weight (e.g., a second digital number) associated with the layer of the neural network. For example, the weight may comprise a binary number (e.g., $W_4$, $W_3$, $W_2$, $W_1$, $W_0$) representing a total value of the weight, and may include a sign bit (e.g., $W_4$) denoting whether the weight is positive or negative. Similarly, the input may comprise a binary number (e.g., $X_4$, $X_3$, $X_2$, $X_1$, $X_0$) representing a total value of the input, and may include a sign bit (e.g., $X_4$) denoting whether the input is positive or negative. In this example, the input is a binary number 11100 (the sign bit is the highest order bit and is "1," therefore negative) and the weight is 11001 (the sign bit is the highest order bit and is "1," therefore negative). Thus, the input and the weight are both negative values.

The first-fourth capacitors 310*a*-310*d* may be binary weighted meaning that a capacitance of the respective capacitor of the first-fourth capacitors 310*a*-310*d* is weighted based on bit position. For example, the fourth capacitor 310*d* is may multiply the least significant bits of the input and the weight, and therefore have a capacitance of "2° C." (e.g., 1 femtofarad). The third capacitor 310*c* may multiply the values of the first bit positions of the input and the weight, and therefore have a capacitance of "$2^1$C" (e.g., 2 femtofarad). The second capacitor 310*b* may multiply the values of the second bit positions of the input and the weight, and therefore have a capacitance of "$2^2$C" (e.g., 4 femtofarad). The first capacitor 310*a* may multiply the values of the third bit positions of the input and the weight, and therefore have a capacitance of "$2^3$C" (e.g., 8 femtofarad). In doing so, the capacitors 310 inherently weight the products of the first-fourth capacitors 310*a*-310*d* such that higher ordered bits provide a greater electrical charge while lower order bits provide the least electrical charge. Thus, the first-fourth capacitors 310*a*-310*d* output charges corresponding to the capacitances where the capacitances correspond to the bit positions multiplied by the first-fourth capacitors 310*a*-310*d*. That is, the charge of a respective capacitor of the first-fourth capacitors 310*a*-310*d* is based on the capacitance of the respective capacitor times the voltage across the two plates of the respective capacitor. Thus, increasing capacitance of the respective capacitor increases the charge.

In a first clock phase Ph_inx of the timing diagram 302, the input and sign (e.g., positive or negative) of the product of the input and weight is programmed into the first-fourth capacitors 310*a*-310*d*. In this example, a first reference voltage of $V_{ref}$ 314 is controlled based on the sign of the product input and the weight to output a first value (e.g., +12V) or a second value (e.g., −12V). As an example, $V_{ref}$ 314 may be a battery source that include switches that output voltage from either a positive terminal or a negative terminal to a conductor that connects the first-fourth capacitors 310*a*-310*d*. For example, if the product of the input and the weight is positive, $V_{ref}$ 314 may output a positive value. If the product of the input and weight is negative, $V_{ref}$ 314 may output a negative value. For example, a positive terminal of $V_{ref}$ 314 may be electrically coupled to the first-fourth capacitors 310*a*-310*d* if the product is positive. A negative terminal of $V_{ref}$ 314 (which may be ground) may be electrically coupled to the first-fourth capacitors 310*a*-310*d* if the product is negative.

In this example, both the input and weight have a negative sign. Thus, a product of the input and the weight would be positive (e.g., a negative number multiplied with a negative number is a positive number). As such, $V_{ref}$ 314 outputs the first reference voltage at the first value (e.g., a positive voltage) to the first-fourth capacitors 310*a*-310*d*, and applies the positive voltage to the top plates (may be referred to as first plates) of the first-fourth capacitors 310*a*-310*d*. Therefore, the first-fourth capacitors 310*a*-310*d* are charged based on the positive voltage. As already noted, if the product were hypothetically negative, the first reference voltage would be set to the second value (e.g., negative value or ground) to charge the top plate of the first-fourth capacitors 310*a*-310*d*.

The process 300 controls charging of the bottom plates (which may be referred to as second plates) of the first-fourth capacitors 310*a*-310*d* based on the bits of the input. For example, when the value of the input at a particular bit position is "0," the bottom plate of a corresponding capacitor of the first-fourth capacitors 310*a*-310*d* is connected to the first reference voltage to bypass charging. In contrast, when the value of the input is "1", the bottom plate of a corresponding capacitor of the first-fourth capacitors 310*a*-310*d* is connected to ground to enable charging (e.g., for a single ended version). It will be understood that rather than ground, the bottom plate may be connected to any voltage (e.g., mid-voltage of positive and/or negative reference voltages) in some embodiments such as a differential based embodiment.

In this example, the first capacitor 310*a* is to program the input value "1" (i.e., bit position 3 of the input is 1). Thus, the bottom plate of the first capacitor 310*a* is connected to ground through the fifth switch 308*e*, and is electrically disconnected from the first reference voltage by the first switch 308*a*. Thus, due to the electric voltage difference, the first capacitor 310*a* is charged.

The second capacitor 310*b* is to program the input value "1" (i.e., bit position 2 of the input is 1). Thus, the bottom plate of the second capacitor 310*b* is connected to ground through the sixth switch 308*f*, and is electrically disconnected from the first reference voltage by the second switch 308*b*. Thus, due to the electric voltage difference, the second capacitor 310*b* is charged.

The third capacitor 310*c* is to program the input value "0" (i.e., bit position 1 of the input is 0). Thus, the bottom plate of the third capacitor 310*c* is connected to the first reference voltage by third switch 308*c*, and is electrically disconnected from ground through the seventh switch 308*g*. Thus, the first reference voltage is applied to the top and bottom plates of the third capacitor 310*c*. In some embodiments, rather the first voltage being applied to the bottom plates, a second voltage (e.g., ground) may be applied to the top and bottom plates to discharge the third capacitor 310*c*. Therefore there is no electric voltage difference across the third capacitor 310*c* and thus the third capacitor 310*c* is not charged. Thus, when the input value is 0, the third capacitor 310*c* may be discharged through either positive reference (e.g., first reference) or negative reference (e.g., second reference) depending on the multiplication sign of the input and weight bits.

In this example, the fourth capacitor 310*d* is to program the input value "0" (i.e., bit position 1 of the input is 0). Thus, the bottom plate of the fourth capacitor 310*d* is connected to the first reference voltage by fourth switch 308*d*, and is electrically disconnected from ground through the eighth switch 308*h*. Thus, since the first reference voltage is applied to the top and bottom plates of the fourth capacitor 310*d*, there is no electric voltage difference across the fourth capacitor 310*d*, the fourth capacitor 310*d* is not charged.

Thus, as discussed above, the first clock phase Ph_inx phase completes the several aspects to the multiplication process 300. That is, during the first clock phase Ph_inx phase, the process 300 programs the first-fourth capacitors 310*a*-310*d* based on the sign of the product of the input and weight, and the bits of the input. During the first clock phase Ph_inx, the following equation provides the total charge on the first-fourth capacitors 310_a_-310_d_:

$$\text{Total Charge}=(2^3*X3+2^2*X2+2^1*X1+2^0*X0)*C*V(V_{REF}) \quad \text{Equation 1}$$

In Equation 1, X3, X2, X1, X0 are the different values of the input at bit positions 3-0 respectively. C is a unit capacitance corresponding to the lowest significant bit of the first-fourth capacitors 310_a_-310_d_ and $V(V_{REF})$ is the first reference voltage.

In a second clock phase Ph_shr1 of the timing diagram 302 (time period $T_2$), charge is shared between all of the first-fourth capacitors 310_a_-310_d_. That is, the bottom plates of all the first-fourth capacitors 310_a_-310_d_ are coupled ground through the fifth-eighth switches 308_e_-308_h_. The top plates are electrically disconnected from the ground and $V_{ref}$ 314 through switches 306, 312. The output of the switched capacitor-based multiplication architecture 304 is $V_{out1}$ that is equal to Equation 2:

$$V_{out1}=1/15*(2^3*X3+2^2*X2+2^1*X1+2^0*XO)*V(V_{REF}) \quad \text{Equation 2}$$

In Equation 2, X3, X2, X1, X0 are the different values of the input at bit positions 3-0 respectively. $V(V_{REF})$ is the first reference voltage.

In the third clock phase Ph_inw of the timing diagram 302 (time period $T_3$), voltages are sampled on the first-fourth capacitors 310_a_-310_d_ depending on the weight (e.g., digital value of the weight). During the third clock phase Ph_inw, the input may be multiplied by selectively discharging capacitors of the first-fourth capacitors 310_a_-310_d_.

The values of the weight are illustrated along the bottom of the corresponding capacitors of the first-fourth capacitors 310_a_-310_d_ that will execute the multiplication operation based on a corresponding value of the weight. When the weight bit is a value of 1, the bottom plate of a capacitor of the first-fourth capacitors 310_a_-310_d_ associated with that weight bit is left open to retain the voltage on that capacitor. When the weight bit is a value of 0, the bottom plate of a respective capacitor of the first-fourth capacitors 310_a_-310_d_ associated with that weight bit is closed to connect the bottom plate to ground and discharge the respective capacitor. The switch 312 is also closed to provide ground voltage to the conductor that connects top plates of the first-fourth capacitors 310_a_-310_d_ such that the ground voltage is applied to the top plates.

In this example, the first capacitor 310_a_ is to program the weight value "1" (i.e., bit position 3 of the weight is a value of 1). Thus, the bottom plate of the first capacitor 310_a_ is disconnected from ground by the first switch 308_a_ and the fifth switch 308_e_ which are both opened.

The second capacitor 310_b_ is to program the weight value "0" (i.e., bit position 2 of the weight is a value of 0). Thus, the bottom plate of the second capacitor 310_b_ is connected to ground by the sixth switch 308_f_ and thus discharges until the energy stored by the second capacitor 310_b_ is zero.

The third capacitor 310_c_ is to program the weight value "0" (i.e., bit position 1 of the weight is a value of 0). Thus, the bottom plate of the third capacitor 310_c_ is connected to ground by the seventh switch 308_g_ and thus discharges capacitance until the energy stored by the third capacitor 310_c_ is zero.

The fourth capacitor 310_d_ is to program the weight value "1" (i.e., bit position 0 of the weight is a value of 1). Thus, the bottom plate of the fourth capacitor 310_d_ is disconnected from ground by the fourth switch 308_d_ and the eighth switch 308_h_.

In a fourth clock phase Ph_shr2 (time period $T_3$), charge is shared between all the first-fourth capacitors 310_a_-310_d_ by connecting bottom plates of all the first-fourth capacitors 310_a_-310_d_ to ground through fifth-eighth switches 308_e_-308_h_, and the top plates are disconnected from the first reference voltage by opening switch 306. Thus, the fourth clock phase Ph_shr2 is used to accumulate the charge. $V_{out2}$ is an analog signal and is the product of the weight (W) and the input (X). Equation 3 describes $V_{out2}$:

$$V_{out2}=1/15*(2^3*W3+2^2*W2+2^1*W1+2^0*WO)*V_{out1}*V(V_{REF}) \quad \text{Equation 3}$$

In Equation 3, W3, W2, W1, W0 are the different values of the weight at bit positions 3-0 respectively of the weight. $V(V_{REF})$ is the first reference voltage and $V_{out1}$ is calculated in Equation 2. The above may be simplified to obtain Equation 4 below:

$$V_{out2}=1/15*1/15*(2^3*W3+2^2*W2+2^1*W1+2^0*WO)*(2^3*X3+2^2*X2+2^1*X1+2^0*X0)*V(V_{REF}) \quad \text{Equation 4}$$

In some examples, the switched capacitor-based multiplication architecture 304 may be part of a multiply-accumulate (MAC) architecture that includes a plurality of multiply accumulators. The switched capacitor-based multiplication architecture 304 may be one of the multipliers of such a MAC architecture. Outputs from the multipliers, which may all be formed similarly to the switched capacitor-based multiplication architecture 304, may provide outputs to an accumulator that sums the outputs from the multipliers to generate a final output. It is worthwhile to note that there are multiple possible circuit implementations to execute the switch based capacitor based multiply algorithm described above.

Figure 2:
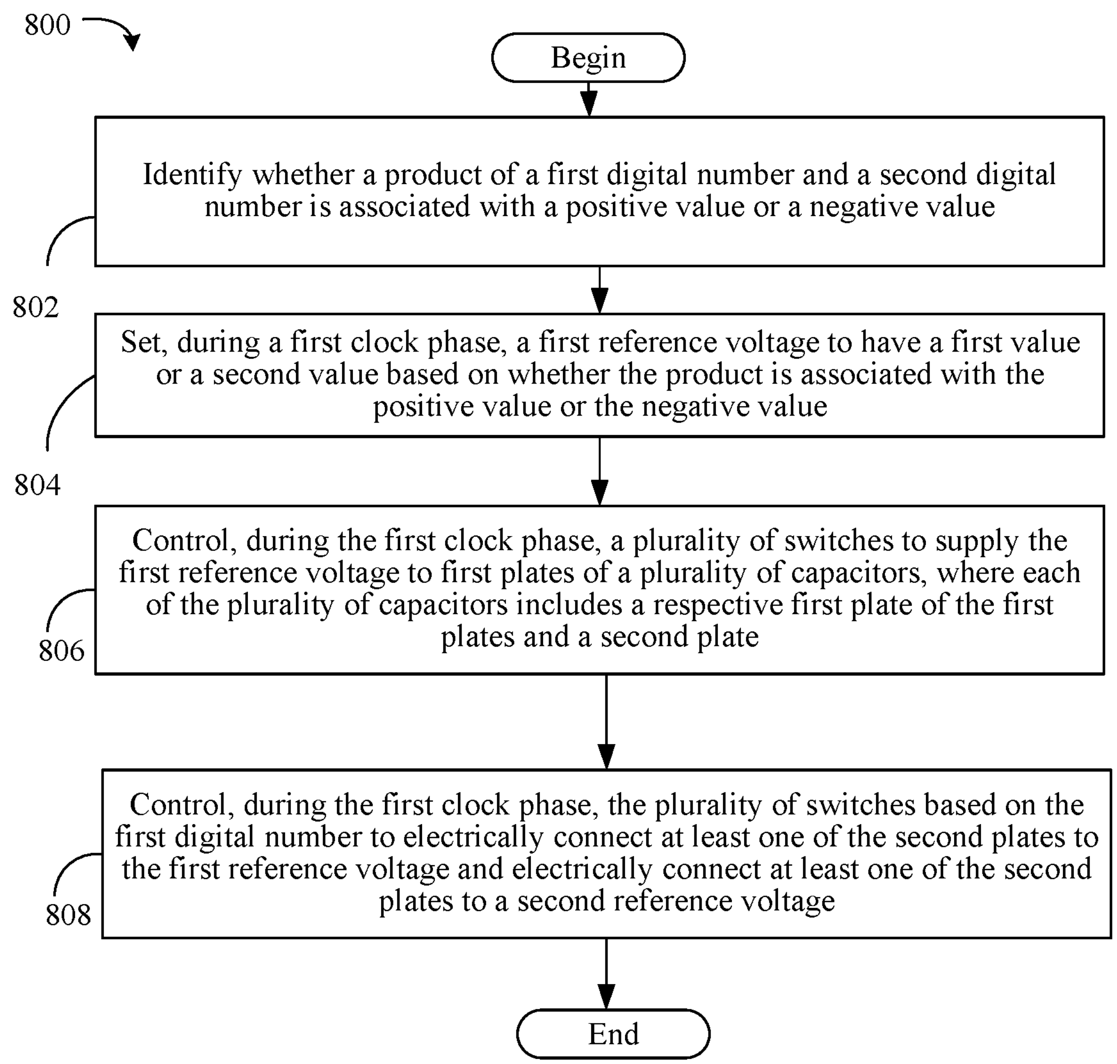
FIG. 2 is a flowchart of an example of a method of executing a multiplication process with a plurality of capacitors according to an embodiment.

FIG. 2 shows a method 800 of executing a multiplication process with a plurality of capacitors. The method 800 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field-programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 800 may be written in any combination of one or more programming languages, including RTL, object oriented programming languages such as JAVA, SMALLTALK, C++, CUDA or the like, and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 802 identifies whether a product of a first digital number and a second digital number is associated with a positive value or a negative value. Illustrated processing block 804 sets, during a first clock phase, a first reference voltage to have a first value or a second value based on whether the product is associated with the positive value or the negative value. Illustrated processing block 806 controls, during the first clock phase, a plurality of switches to supply the first reference voltage to first plates of a plurality of capacitors, where each of the plurality of capacitors includes a respective first plate of the first plates and a second plate. Illustrated processing block 808 controls, during the first clock phase, the plurality of switches based on the first digital number to electrically connect at least one of the second plates to the first reference voltage and electrically connect at least one of the second plates to a second reference voltage.

In some embodiments, the method 800 further includes electrically connecting the first plates to an output and electrically connecting the second plates to the second reference voltage. In such embodiments, the method 800 further determines that a first capacitor of the plurality of capacitors is associated with a low value of the second digital number, and controls the plurality of switches during a third clock phase to electrically connect the first plates to a third reference voltage, and electrically connect the second plate of the first capacitor to the second reference voltage based on the first capacitor being associated with the low value. Further, in some embodiments the method 800 further includes determining that a second capacitor of the plurality of capacitors is associated with a high value of the second digital number, and during the third clock phase, controlling the plurality of switches to electrically disconnect the second plate of the second capacitor from the second reference voltage based on the second capacitor being associated with the high value. Further still, in some embodiments the method 800 includes electrically connecting the first plates to an output, and electrically connecting the second plates to the second reference voltage. In some embodiments, the second reference voltage is a ground voltage, the first digital number is an input associated with a neural network and the second digital number is a weight associated with the neural network.

Figure 3:
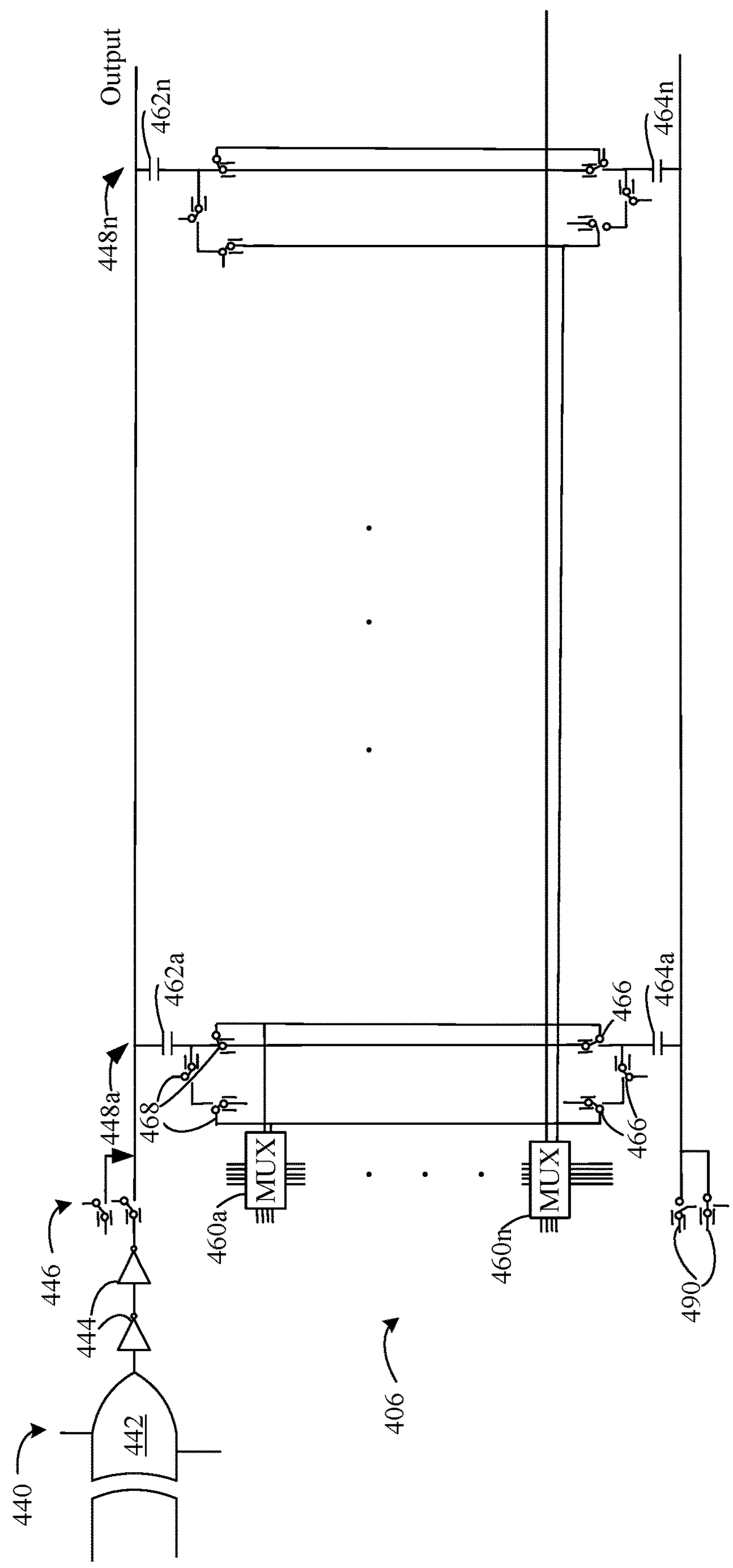
FIG. 3 is a block diagram of an example of a differential capacitor architecture according to an embodiment.

FIG. 3 illustrates a schematic implementation of some embodiments with a differential capacitor architecture 440. The differential capacitor architecture 440 includes a XOR gate 442 and inverters 444 that receives the signed bits of an input and a weight. The XOR gate 442 and inverters 444 generate an output corresponding to a sign of the product of the input and the weight. The switches 446, 448 may select between a first value (e.g., positive) of $V_{ref}$ or a second value (e.g., ground of a negative voltage) of $V_{ref}$ that is lower than the first value. The switches 446, 448 may each be two switches which reduces size and a number of components as compared to other implementations. The switches 446, 490 may provide the same to a plurality of branches 448a-448n.

The differential capacitor architecture 440 includes the plurality of branches 448a-448n that each operate on different bit positions of an input and weight. For example, a first branch 448a may multiply values in a highest order bit position (excluding the sign bit) of the input and the weight, while the N branch 448n may multiply values in a lowest order bit position of the input and the weight. MUXs 460a-460n may provide the input and weight values of different bit positions to the plurality of branches 448a-448n. Each of the plurality of branches 448a-448n includes a pair of capacitors from plurality of capacitors 462a-462n, 464a-464n. The plurality of capacitors includes a positive capacitor array 462a-462n and a negative capacitor array 464a-464n that connected to output lines through switches 466, 468.

If the sign of the product is positive, then the first value (e.g., a positive voltage) of $V_{ref}$ will be provided to positive capacitor array 462a-462n and the second value (e.g., ground or negative voltage) will be provided to the negative capacitor array 464a-464n. In doing so, the negative capacitor array 464a-464n may not be charged while the positive capacitor array 462a-462n may be charged. If the sign of the product is negative, then the second value of $V_{ref}$ will be provided to the positive capacitor array 462a-462n and the first value will be provided to the negative capacitor array 464a-464n. In doing so, the positive capacitor array 462a-462n may not be charged while the negative capacitor array 464a-464n may be charged. The final output may be a capacitor charge that is equal to a charge of the positive capacitor array 462a-462n minus a charge of the negative capacitor array 464a-464n and may be a product of a multiplication operation. It is worthwhile to note that there are multiple possible circuit implementations to execute the switch based capacitor based multiply algorithm described above.

Figure 4:
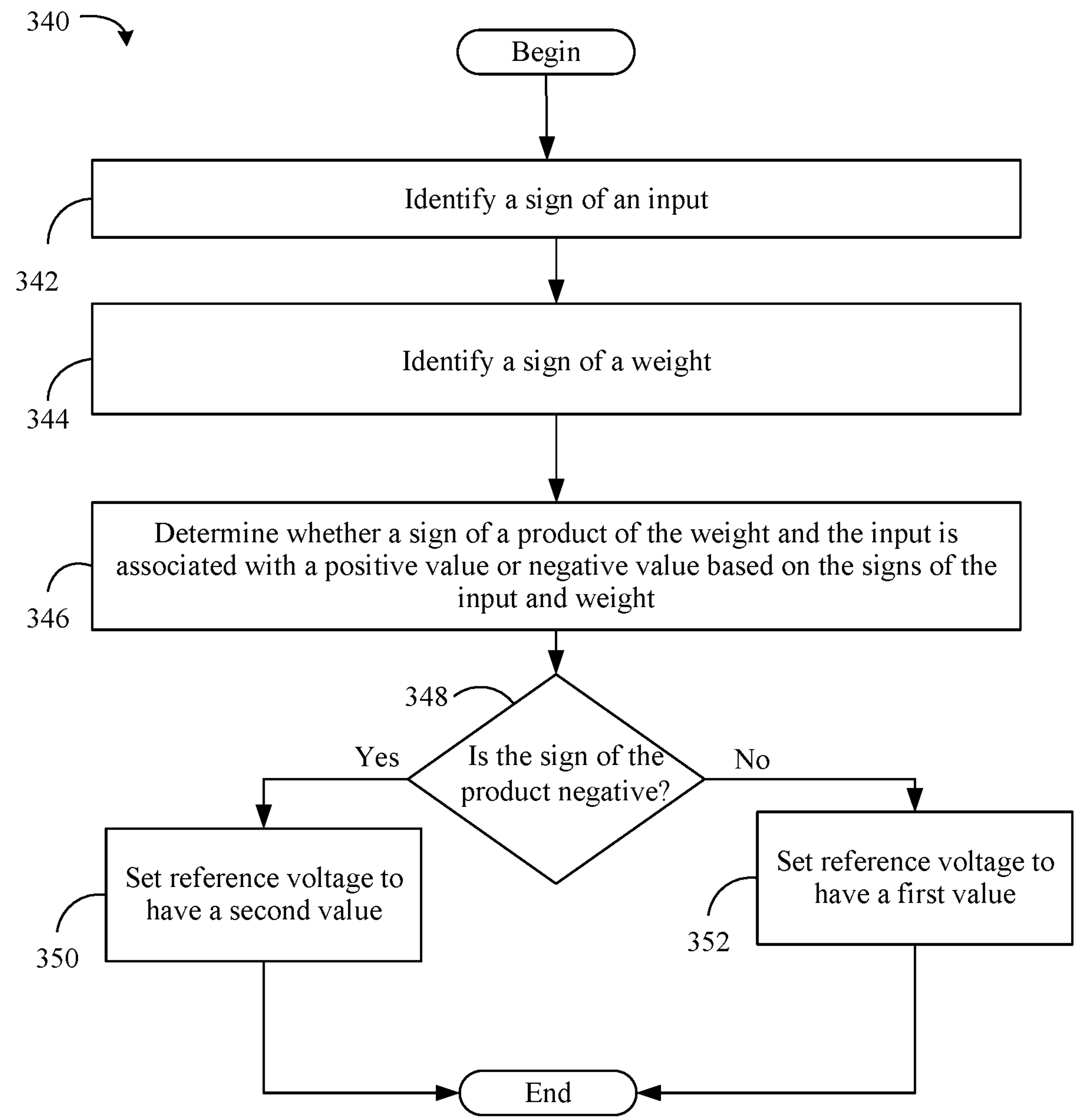
FIG. 4 is a flowchart of an example of a method of assigning a value to a reference voltage based on a product of first and second digital numbers according to an embodiment.

FIG. 4 illustrates a method 340 of assigning a value to a reference voltage based on a product of first and second digital numbers. The 340 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 342 identifies a sign of an input. Illustrated processing block 344 identifies a sign of a weight. Illustrated processing block 346 determines whether a sign of a product of the weight and the input is associated with a positive value or negative value based on the signs of the input and weight. Illustrated processing block 348 determines if the sign of the product negative. If so, illustrated processing block 350 sets a reference voltage to have a second value (e.g., a negative value or ground). Otherwise, illustrated processing block 352 sets the reference voltage to have a first value (e.g., a positive value).

Figure 5A:
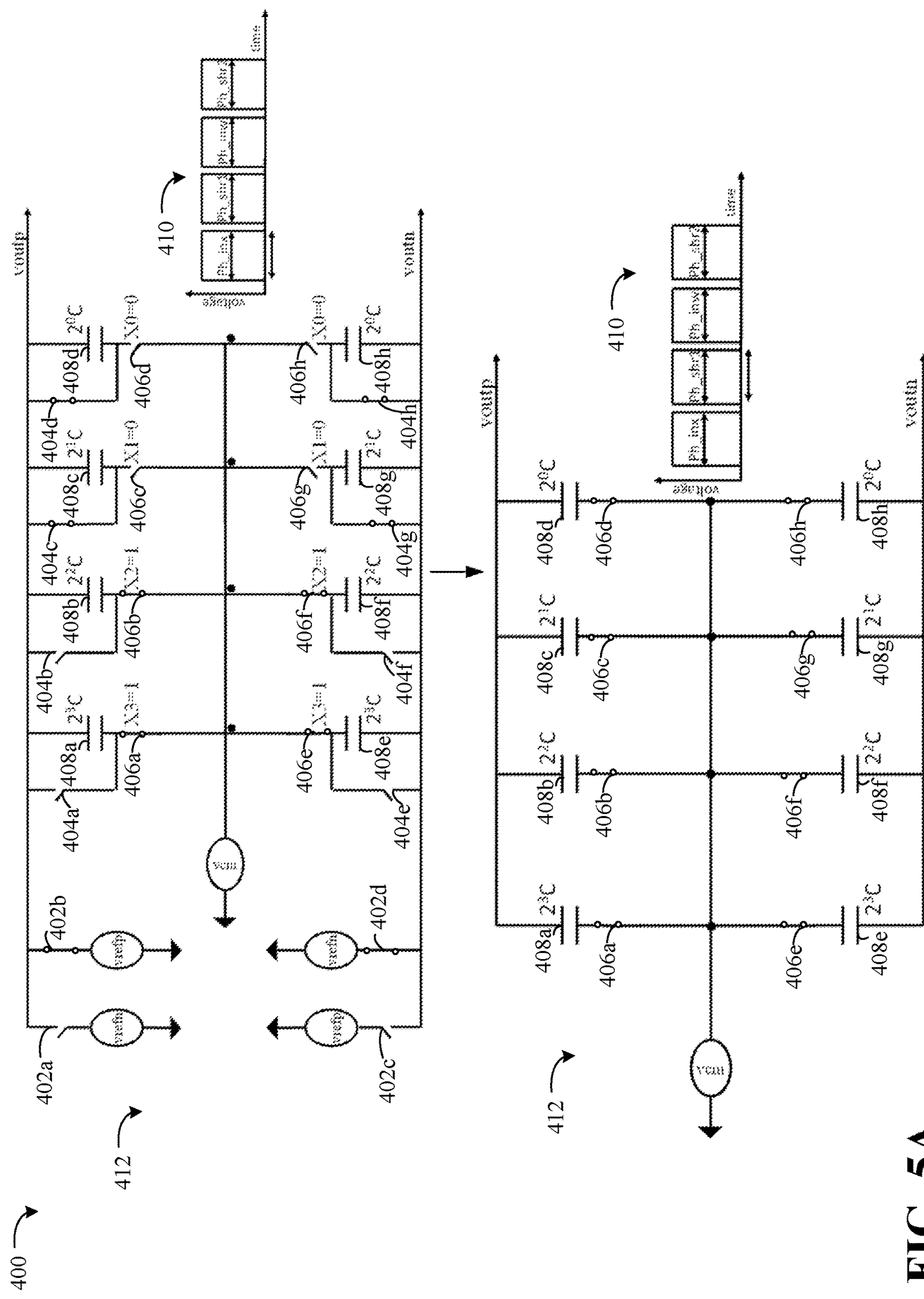
FIGS. 5A-5B are diagrams of an example of a differential multiplication process according to an embodiment.

FIG. 5A illustrates a differential multiplication process 400. The differential multiplication process 400 includes some aspects that are similar to the multiplication process 300 (FIG. 1) already discussed. Such similar aspects may be omitted with respect to the discussion of differential multiplication process 400 for brevity.

Differential multiplication process 400 includes a timing diagram 410 and a differential switched capacitor-based multiplication architecture 412. The differential switched capacitor-based multiplication architecture 412 is adjusted during different time periods of the timing diagram 410 to execute a multiplication operation. For example, a computing device, hardware device, logic (e.g., configurable logic and/or fixed-function logic hardware) or other structure may adjust the differential switched capacitor-based multiplication architecture 412 to enable a low latency and efficient multiplication operation.

The differential switched capacitor-based multiplication architecture 412 includes a power distribution switches 402a, 402b, 402c, 402d to selectively connect power sources vrefn (supplies negative voltage), vrefp (supplies positive voltage) to a positive capacitor array 408a, 408b, 408c, 408d and a negative capacitor array 408e, 408f, 408g, 408h. The positive capacitor array 408a, 408b, 408c, 408d and the negative capacitor array 408e, 408f, 408g, 408h have different capacitances as described above with respect to the multiplication process 300 (FIG. 1).

The first clock phase PH_inx is discussed. In this example, respective values of the input X0-X3 (e.g., least significant-most significant bits) are illustrated next to respective capacitors of the positive capacitor array 408*a*, 408*b*, 408*c*, 408*d* and the negative capacitor array 408*e*, 408*f*, 408*g*, 408*h* that will be programmed with the respective value.

The power distribution switches 402*a*, 402*b*, 402*c*, 402*d* are selectively opened or closed depending on whether a positive or negative (or ground) voltage is to be applied to plates of the positive capacitor array 408*a*, 408*b*, 408*c*, 408*d* and the negative capacitor array 408*e*, 408*f*, 408*g*, 408*h*, and based on whether a product of the input and a weight is a positive or negative value. For example, if the product is the positive value, a positive voltage is applied to the positive capacitor array 408*a*, 408*b*, 408*c*, 408*d* and a negative voltage is applied to the negative capacitor array 408*e*, 408*f*, 408*g*, 408*h*. If the product is negative, then the converse occurs. In other words, a negative voltage is applied to the positive capacitor array 408*a*, 408*b*, 408*c*, 408*d* and a positive voltage is applied to the negative capacitor array 408*e*, 408*f*, 408*g*, 408*h*. In this example, the product is positive and therefore a positive voltage from vrefp is supplied to the positive capacitor array 408*a*, 408*b*, 408*c*, 408*d* via power distribution switch 402*b*, and a negative voltage is supplied from vrefn to the negative capacitor array 408*e*, 408*f*, 408*g*, 408*h* via power distribution switch 402*d*.

A first plurality of switches 404*a*, 404*b*, 404*c*, 404*d*, 404*e*, 404*f*, 404*g*, 404*h* selectively control application of the positive voltage from vrefp to bottom plates of the positive capacitor array 408*a*, 408*b*, 408*c*, 408*d* and the negative voltage from vrefn to top plates of the negative capacitor array 408*e*, 408*f*, 408*g*, 408*h*. A second plurality of switches 406*a*, 406*b*, 406*c*, 406*d*, 406*d*, 406*e*, 406*f*, 406*g*, 406*h* further control whether an input voltage from vcm is applied to bottom plates of the positive capacitor array 408*a*, 408*b*, 408*c*, 408*d* and top plates of the negative capacitor array 408*e*, 408*f*, 408*g*, 408*h*.

The first plurality of switches 404*a*-404*h* and the second plurality of switches 406*a*-406*h* are selectively controlled based on the value of the input to be programmed. For example, capacitor 408*a* is to be charged to program a value of "1," and therefore switch 404*a* is opened to electrically disconnect the bottom plate of the capacitor 408*a* from the positive voltage, and the switch 406*a* is closed to electrically connect the bottom plate to the input voltage. The capacitor 408*c* is to not be charged (or minimally charged) to program a value of "0," and therefore switch 404*c* is closed to electrically connect the bottom plate of the capacitor 408*c* from the positive voltage, and the switch 406*c* is opened to electrically disconnect the bottom plate from the input voltage.

The second clock phase PH_shr1 is discussed. Portions of the differential switched capacitor-based multiplication architecture 412 that are electrically disconnected from the capacitors 408*a*-408*h* via switches 402*a*-402*d* and the first plurality of switches 404*a*-404*h* are omitted for clarity. As illustrated, the second plurality of switches 406*a*-406*h* are closed to conduct electricity.

Figure 5B:
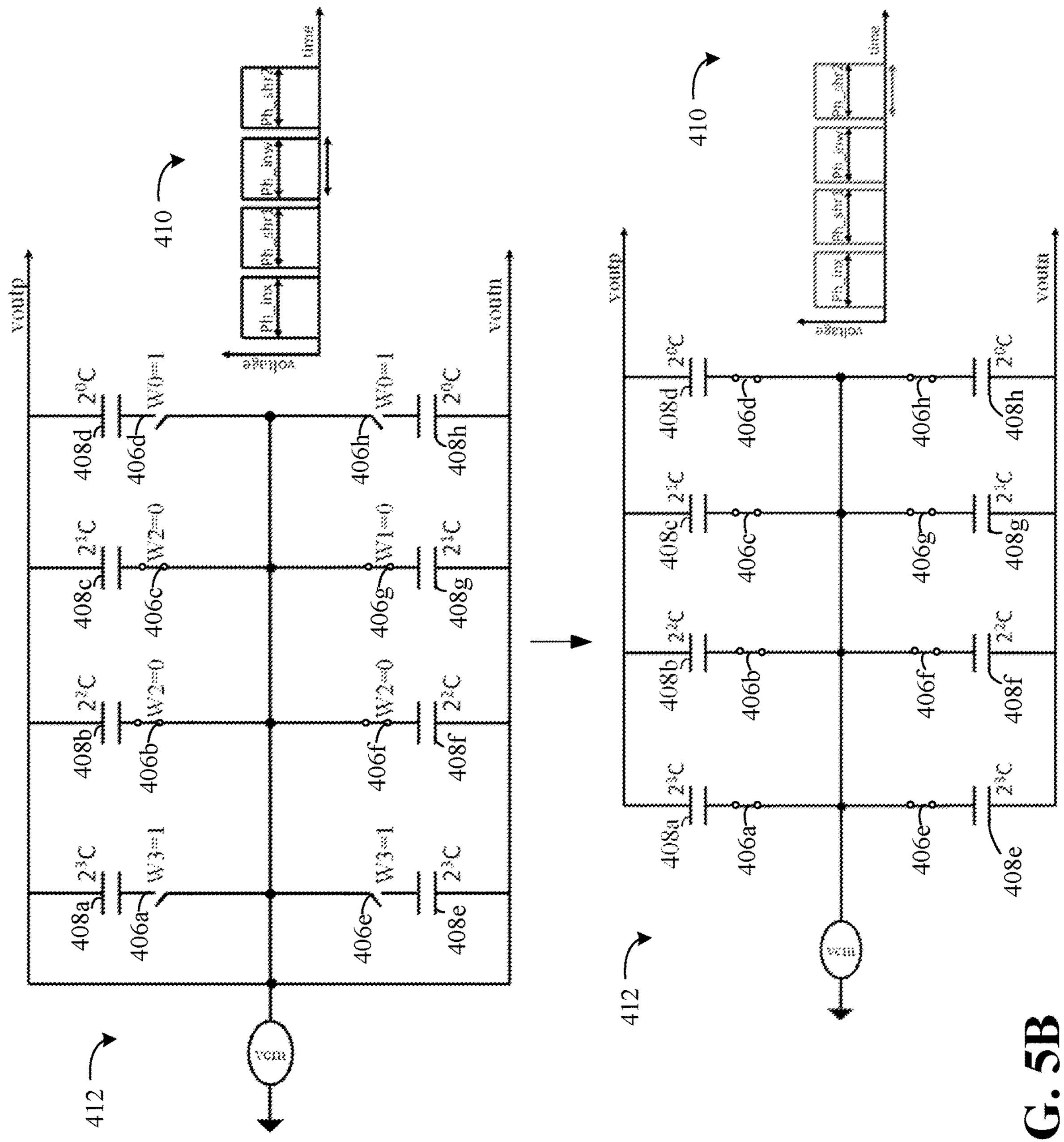

Turning to FIG. 5B, the third clock phase PH_inw is discussed. In this example, the second plurality of switches 406*a*-406*h* are selectively closed or opened to program values of the weight W0-W3 (least significant bit—most significant bit respectively). A respective switch of the second plurality of switches 406*a*-406*h* is opened to not conduct electricity when the value is "1." A respective switch of the second plurality of switches 406*a*-406*h* is closed to conduct electricity and enable discharge when the value is "0." Thus, the capacitor 408*a* is to program a weight value of 1, and the switch 406*a* is therefore opened to avoid discharging the capacitor 408*a*. The capacitor 408*b* is to program a weight value of 0, and therefore the switch 406*b* is closed to discharge the capacitor 408*b*.

The fourth clock phase PH_shr2 is discussed. As illustrated, the second plurality of switches 406*a*-406*h* are closed to conduct electricity. The output is provided at voutp and voutn. The final output (i.e., the product of the input and weight) may be provided by the following equation:

$$\text{Final output} = \text{voutp} - \text{voutn} \qquad \text{Equation 5}$$

Figure 6:
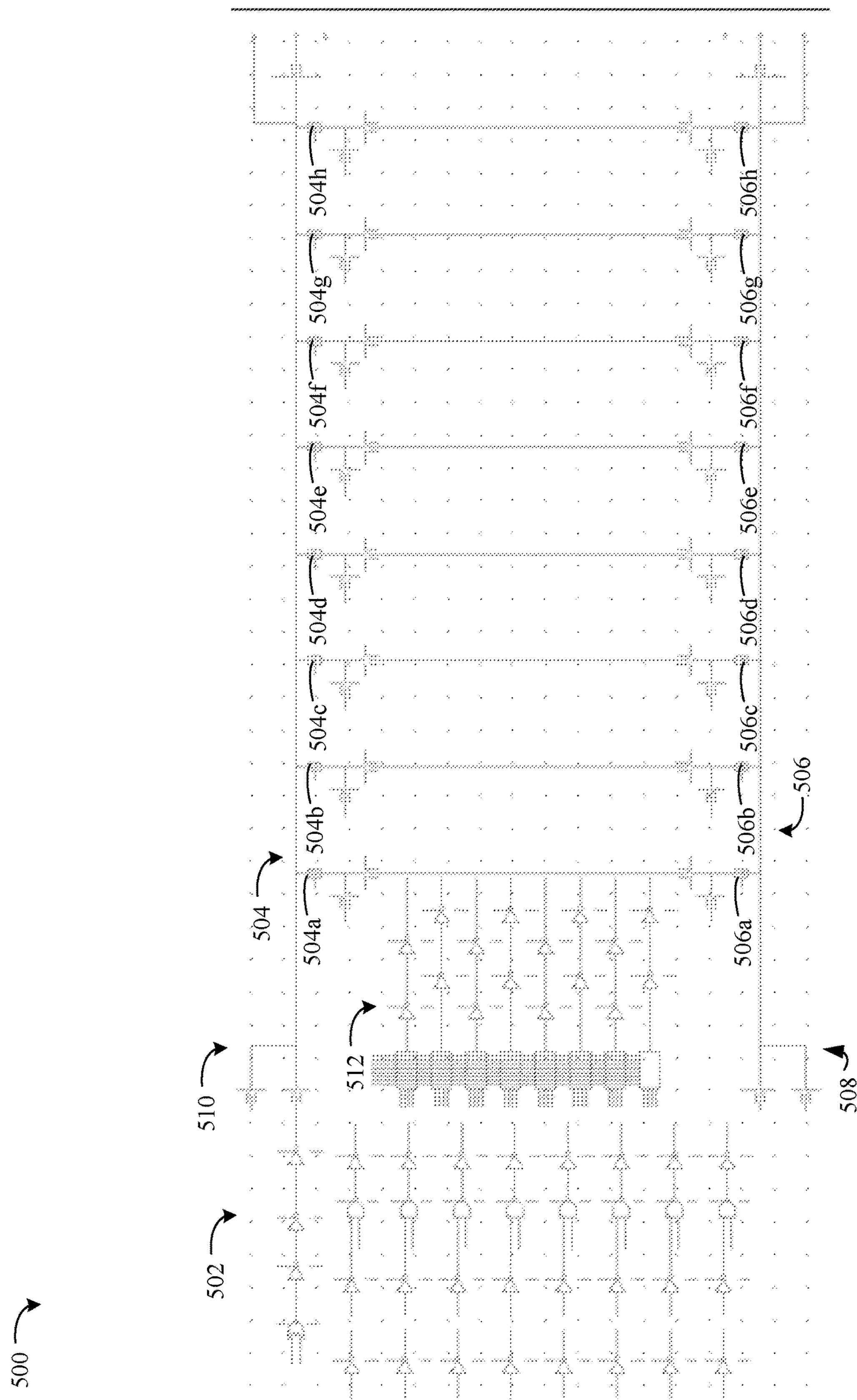
FIG. 6 is a schematic of an example of a differential capacitor architecture according to an embodiment.

FIG. 6 illustrates a schematic implementation of some embodiments with a differential capacitor architecture 500. The differential capacitor architecture 500 includes product identification portion 502 (e.g., XOR gates and inverters) that receives the signed bits of an input and a weight. The product identification portion 502 generates an output corresponding to a sign of the product of the input and the weight. The switches 508, 510 may select between a first value (e.g., positive) of $V_{ref}$ or a second value (e.g., ground of a negative voltage) of $V_{ref}$ that is lower than the first value. The switches 510 may each be two switches which reduces size and a number of components as compared to other implementations. The switches 508, 510 may provide the selected voltages to a positive capacitor array 504 which includes switches and capacitors 504*a*-504*h*, and a negative capacitor array 506 which includes switches and capacitors 506*a*-506*h*.

For example, if the product is positive, then the first value is provided to the positive capacitor array 504 and the second value is provided to the negative capacitor array 506. If the product is negative, then the second value is provided to the positive capacitor array 504 and the first value is provided to the negative capacitor array 506. Each of the capacitors 504*a*-504*h* operates on a different bit of the input and weight. Each of the capacitors 506*a*-506*h* operates on a different bit of the input and weight. A data provider portion 512 (e.g., MUXs and inverters) may provide the input and weight values of different bit positions to the positive capacitor array 504 and the negative capacitor array 506.

If the sign of the product is positive, then the first value (e.g., a positive voltage) of $V_{ref}$ will be provided to positive capacitor array 504 and the second value (e.g., ground or negative voltage) will be provided to the negative capacitor array 506. In doing so, the negative capacitor array 506 may not be charged while the positive capacitor array 504 may be charged. If the sign of the product is negative, then the second value will be provided to the positive capacitor array 504 and the first value will be provided to the negative capacitor array 506. In doing so, the positive capacitor array 504 may not be charged while the negative capacitor array 506 may be charged. The final output may be a capacitor charge that is equal to a charge of the positive capacitor array 504 minus a charge of the negative capacitor array 506 (e.g., a product of the input and the weight). It is worthwhile to note that there are multiple possible circuit implementations to execute the switch based capacitor based multiply algorithm described above.

Figure 7:
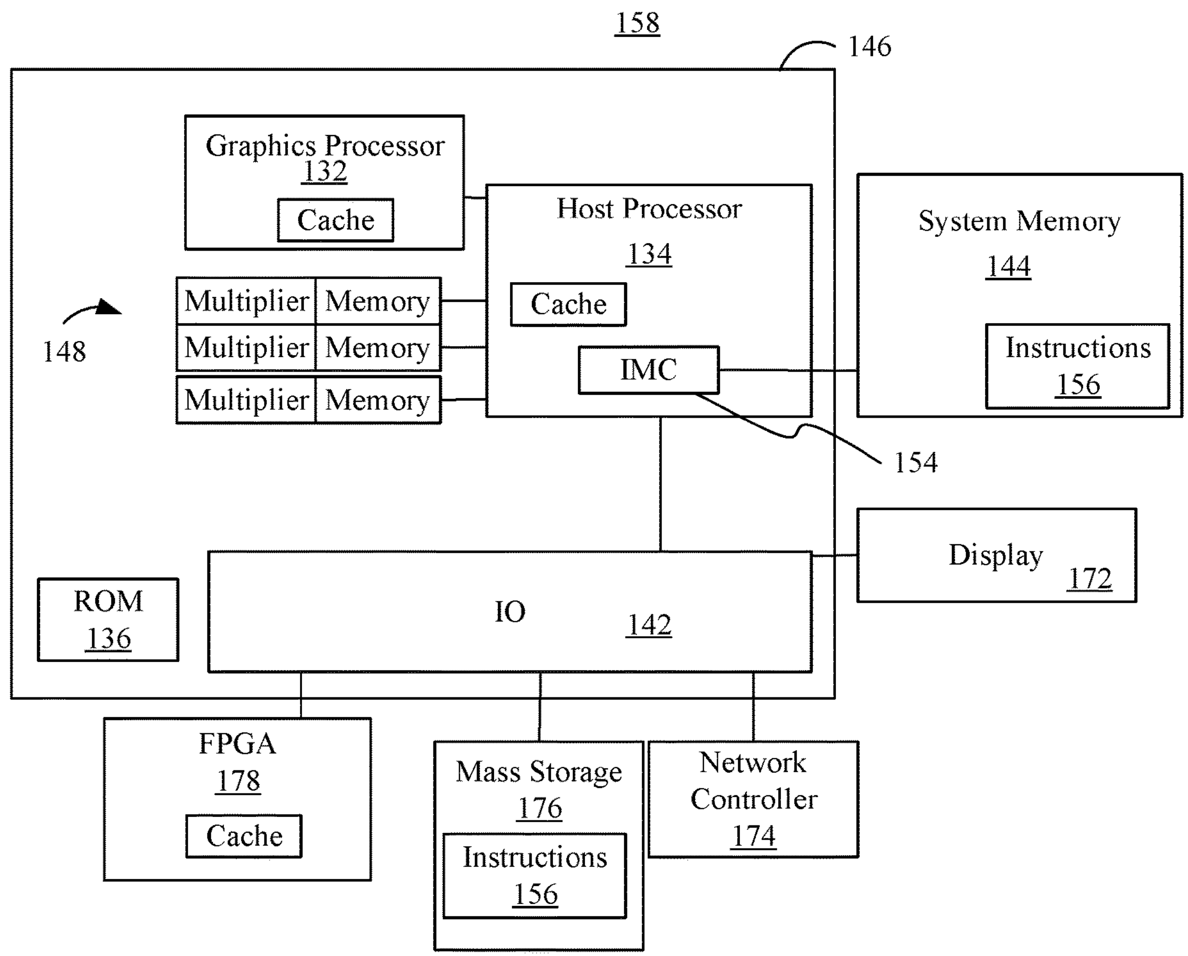
FIG. 7 is a block diagram of an example of a computation-efficient computing system according to an embodiment.

Turning now to FIG. 7, memory-efficient computing system 158 is shown. The system 158 may generally be part of an electronic device/platform having computing functionality (e.g., personal digital assistant/PDA, notebook computer, tablet computer, convertible tablet, server), communications functionality (e.g., smart phone), imaging functionality (e.g., camera, camcorder), media playing functionality (e.g., smart television/TV), wearable functionality (e.g., watch, eyewear, headwear, footwear, jewelry), vehicular functionality (e.g., car, truck, motorcycle), robotic functionality (e.g., autonomous robot), etc., or any combination thereof. In the illustrated example, the system 158 includes a host processor 134 (e.g., CPU) having an integrated memory controller (IMC) 154 that is coupled to a system memory 144 that includes instructions 156 that when executed, may implement one or more aspects of the embodiments.

The illustrated system 158 also includes an input output (10) module 142 implemented together with the host processor 134, a graphics processor 132 (e.g., GPU), ROM 136 and switched capacitor-based multiplication architectures 148 on a semiconductor die 146 as a system on chip (SoC). The illustrated 10 module 142 communicates with, for example, a display 172 (e.g., touch screen, liquid crystal display/LCD, light emitting diode/LED display), a network controller 174 (e.g., wired and/or wireless), FPGA 178 and mass storage 176 (e.g., hard disk drive/HDD, optical disk, solid state drive/SSD, flash memory) that when executed, may implement one or more aspects of the embodiments. Furthermore, the SoC 146 may further include processors (not shown) and/or switched capacitor-based multiplication architectures 148 dedicated to artificial intelligence (AI) and/or neural network (NN) processing. For example, the system SoC 146 may include vision processing units (VPUs), tensor processing units (TPUs) and/or other AI/NN-specific processors such as switched capacitor-based multiplication architectures 148, etc. In some embodiments, any aspect of the embodiments described herein may be implemented in the processors and/or accelerators dedicated to AI and/or NN processing such as the switched capacitor-based multiplication architectures 148, the graphics processor 132 and/or the host processor 134. The system 158 may communicate with one or more edge nodes through the network controller 174 to receive weight updates and activation signals (e.g., inputs).

It is worthwhile to note that the system 158 and the switched capacitor-based multiplication architectures 148 may implement the multiplication process 300 (FIG. 1), method 800 (FIG. 2), differential capacitor architecture 440 (FIG. 3), method (340) (FIG. 4), differential multiplication process 400 (FIGS. 5A-5B) and/or the differential capacitor architecture 500 (FIG. 6) already discussed. The illustrated computing system 158 is therefore considered to implement new functionality and is performance-enhanced at least to the extent that it enables the computing system 158 to execute operate on neural network data at a lower latency, reduced power and with greater area efficiency. As illustrated, the switched capacitor-based multiplication architectures 148 include multipliers and memory. Inputs and weights may be provided to the multipliers (which are in close proximity to the memory) to reduce data transfer overhead and latency. The multipliers may each be for example, the switched capacitor-based multiplication architecture 304 (FIG. 1) and/or differential switched capacitor-based multiplication architecture 412 (FIGS. 5A-5B).

Figure 8:
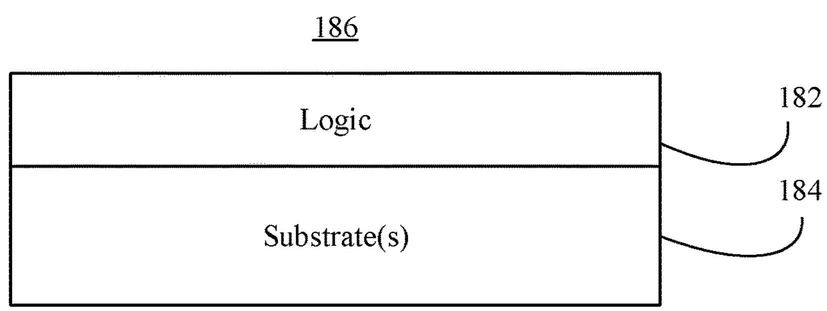
FIG. 8 is an illustration of an example of a semiconductor apparatus according to an embodiment.

FIG. 8 shows a semiconductor apparatus 186 (e.g., chip, die, package). The illustrated apparatus 186 includes one or more substrates 184 (e.g., silicon, sapphire, gallium arsenide) and logic 182 (e.g., transistor array and other integrated circuit/IC components) coupled to the substrate(s) 184. In an embodiment, the apparatus 186 is operated in an application development and/or deployment stage and the logic 182 performs one or more aspects of the embodiments described herein, for example, the multiplication process 300 (FIG. 1), method 800 (FIG. 2), differential capacitor architecture 440 (FIG. 3), method 340 (FIG. 4), differential multiplication process 400 (FIGS. 5A-5B) and/or the differential capacitor architecture 500 (FIG. 6) already discussed. In one example, the logic 182 includes transistor channel regions that are positioned (e.g., embedded) within the substrate(s) 184. Thus, the interface between the logic 182 and the substrate(s) 184 may not be an abrupt junction. The logic 182 may also be considered to include an epitaxial layer that is grown on an initial wafer of the substrate(s) 184.

Figure 9:
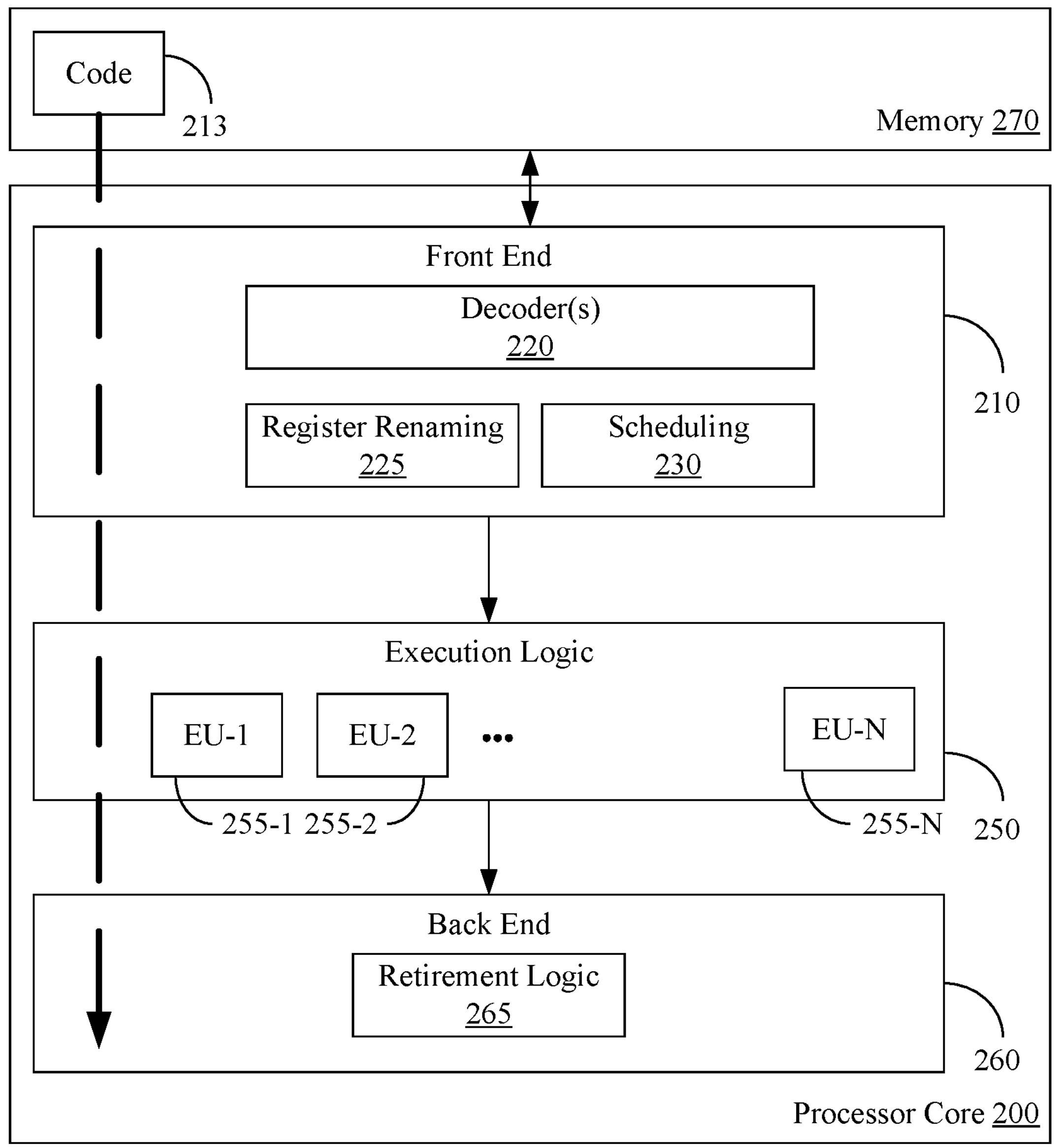
FIG. 9 is a block diagram of an example of a processor according to an embodiment.

FIG. 9 illustrates a processor core 200 according to one embodiment. The processor core 200 may be the core for any type of processor, such as a micro-processor, an embedded processor, a digital signal processor (DSP), a network processor, or other device to execute code. Although only one processor core 200 is illustrated in FIG. 9, a processing element may alternatively include more than one of the processor core 200 illustrated in FIG. 9. The processor core 200 may be a single-threaded core or, for at least one embodiment, the processor core 200 may be multithreaded in that it may include more than one hardware thread context (or "logical processor") per core.

FIG. 9 also illustrates a memory 270 coupled to the processor core 200. The memory 270 may be any of a wide variety of memories (including various layers of memory hierarchy) as are known or otherwise available to those of skill in the art. The memory 270 may include one or more code 213 instruction(s) to be executed by the processor core 200, wherein the code 213 may implement one or more aspects of the embodiments such as, for example, the multiplication process 300 (FIG. 1), method 800 (FIG. 2), differential capacitor architecture 440 (FIG. 3), method 340 (FIG. 4), differential multiplication process 400 (FIGS. 5A-5B) and/or the differential capacitor architecture 500 (FIG. 6) already discussed. The processor core 200 follows a program sequence of instructions indicated by the code 213. Each instruction may enter a front end portion 210 and be processed by one or more decoders 220. The decoder 220 may generate as its output a micro operation such as a fixed width micro operation in a predefined format, or may generate other instructions, microinstructions, or control signals which reflect the original code instruction. The illustrated front end portion 210 also includes register renaming logic 225 and scheduling logic 230, which generally allocate resources and queue the operation corresponding to the convert instruction for execution.

The processor core 200 is shown including execution logic 250 having a set of execution units 255-1 through 255-N. Some embodiments may include a number of execution units dedicated to specific functions or sets of functions. Other embodiments may include only one execution unit or one execution unit that can perform a particular function. The illustrated execution logic 250 performs the operations specified by code instructions.

After completion of execution of the operations specified by the code instructions, back end logic 260 retires the instructions of the code 213. In one embodiment, the processor core 200 allows out of order execution but requires in order retirement of instructions. Retirement logic 265 may take a variety of forms as known to those of skill in the art (e.g., re-order buffers or the like). In this manner, the processor core 200 is transformed during execution of the code 213, at least in terms of the output generated by the decoder, the hardware registers and tables utilized by the register renaming logic 225, and any registers (not shown) modified by the execution logic 250.

Although not illustrated in FIG. 9, a processing element may include other elements on chip with the processor core 200. For example, a processing element may include memory control logic along with the processor core 200. The processing element may include I/O control logic and/or may include I/O control logic integrated with memory control logic. The processing element may also include one or more caches.

Figure 10:
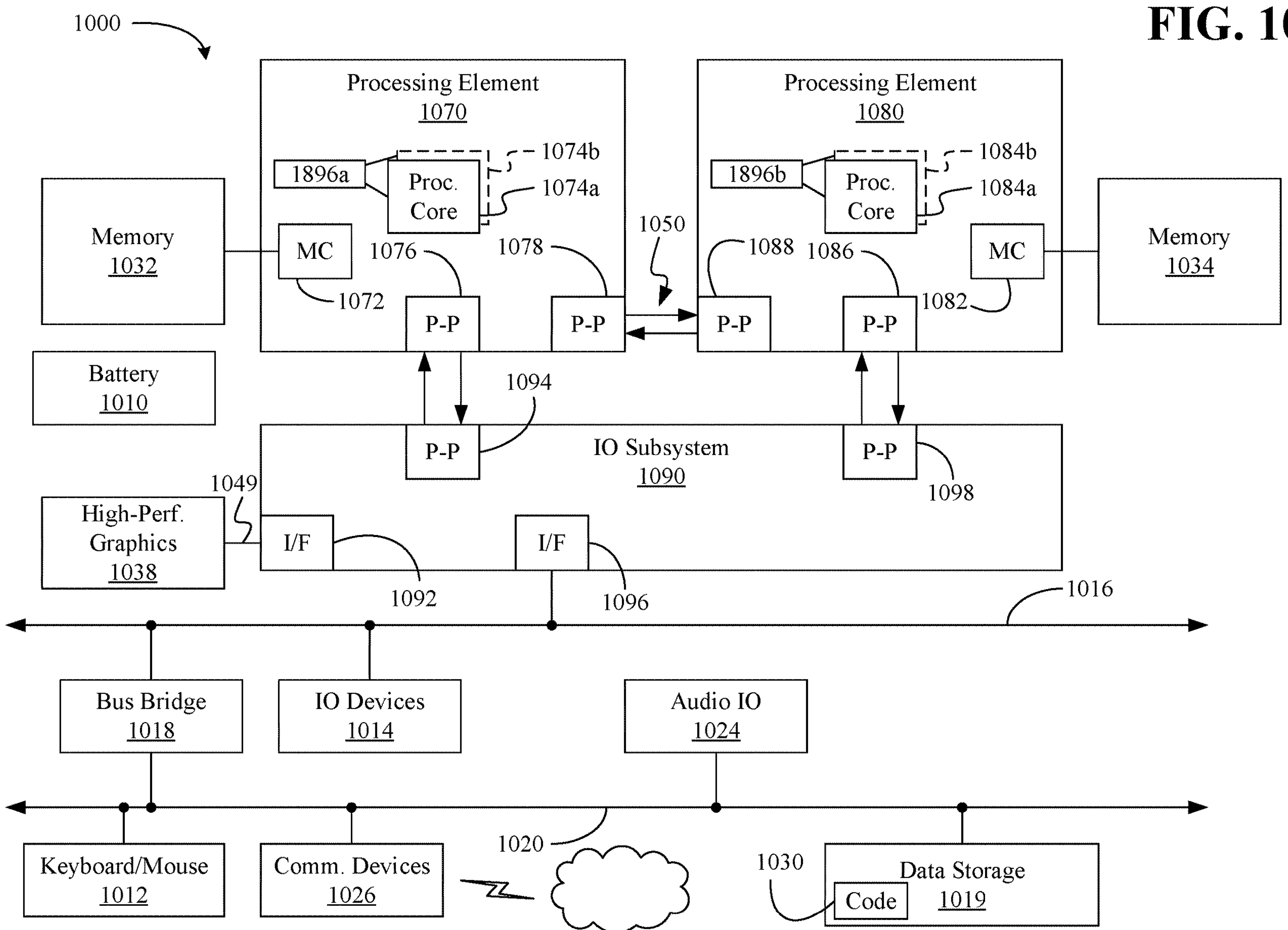
FIG. 10 is a block diagram of an example of a multi-processor based computing system according to an embodiment.

Referring now to FIG. 10, shown is a block diagram of a computing system 1000 embodiment in accordance with an embodiment. Shown in FIG. 9 is a multiprocessor system 1000 that includes a first processing element 1070 and a second processing element 1080. While two processing elements 1070 and 1080 are shown, it is to be understood that an embodiment of the system 1000 may also include only one such processing element.

The system 1000 is illustrated as a point-to-point interconnect system, wherein the first processing element 1070 and the second processing element 1080 are coupled via a point-to-point interconnect 1050. It should be understood that any or all of the interconnects illustrated in FIG. 10 may be implemented as a multi-drop bus rather than point-to-point interconnect.

As shown in FIG. 10, each of processing elements 1070 and 1080 may be multicore processors, including first and second processor cores (i.e., processor cores 1074*a* and 1074*b* and processor cores 1084*a* and 1084*b*). Such cores 1074*a*, 1074*b*, 1084*a*, 1084*b* may be configured to execute instruction code in a manner similar to that discussed above in connection with FIG. 9.

Each processing element 1070, 1080 may include at least one shared cache 1896*a*, 1896*b*. The shared cache 1896*a*, 1896*b* may store data (e.g., instructions) that are utilized by one or more components of the processor, such as the cores 1074*a*, 1074*b* and 1084*a*, 1084*b*, respectively. For example, the shared cache 1896*a*, 1896*b* may locally cache data stored in a memory 1032, 1034 for faster access by components of the processor. In one or more embodiments, the shared cache 1896*a*, 1896*b* may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the embodiments are not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to processor a first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, micro architectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

The first processing element 1070 may further include memory controller logic (MC) 1072 and point-to-point (P-P) interfaces 1076 and 1078. Similarly, the second processing element 1080 may include a MC 1082 and P-P interfaces 1086 and 1088. As shown in FIG. 10, MC's 1072 and 1082 couple the processors to respective memories, namely a memory 1032 and a memory 1034, which may be portions of main memory locally attached to the respective processors. While the MC 1072 and 1082 is illustrated as integrated into the processing elements 1070, 1080, for alternative embodiments the MC logic may be discrete logic outside the processing elements 1070, 1080 rather than integrated therein.

The first processing element 1070 and the second processing element 1080 may be coupled to an I/O subsystem 1090 via P-P interconnects 1076 1086, respectively. As shown in FIG. 10, the I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, bus 1049 may be used to couple the graphics engine 1038 to the I/O subsystem 1090. Alternately, a point-to-point interconnect may couple these components.

In turn, I/O subsystem 1090 may be coupled to a first bus 1016 via an interface 1096. In one embodiment, the first bus 1016 may be a Peripheral Component Interconnect (PCI) bus, or a bus such as a PCI Express bus or another third generation I/O interconnect bus, although the scope of the embodiments are not so limited.

As shown in FIG. 10, various I/O devices 1014 (e.g., biometric scanners, speakers, cameras, sensors) may be coupled to the first bus 1016, along with a bus bridge 1018 which may couple the first bus 1016 to a second bus 1020. In one embodiment, the second bus 1020 may be a low pin count (LPC) bus. Various devices may be coupled to the second bus 1020 including, for example, a keyboard/mouse 1012, communication device(s) 1026, and a data storage unit 1019 such as a disk drive or other mass storage device which may include code 1030, in one embodiment. The illustrated code 1030 may implement the one or more aspects of such as, for example, the multiplication process 300 (FIG. 1), method 800 (FIG. 2), differential capacitor architecture 440 (FIG. 3), method 340 (FIG. 4), differential multiplication process 400 (FIGS. 5A-5B) and/or the differential capacitor architecture 500 (FIG. 6) already discussed. Further, an audio I/O 1024 may be coupled to second bus 1020 and a battery 1010 may supply power to the computing system 1000.

Note that other embodiments are contemplated. For example, instead of the point-to-point architecture of FIG. 10, a system may implement a multi-drop bus or another such communication topology. Also, the elements of FIG. 10 may alternatively be partitioned using more or fewer integrated chips than shown in FIG. 10.

Additional Notes and Examples

Example 1 includes a computing system comprising a memory array to store a first digital number and a second digital number, a plurality of capacitors coupled with the memory array, wherein each of the plurality of capacitors includes a first plate and a second plate, a plurality of switches that selectively couple the plurality of capacitors to a plurality of voltages, and logic that is connected to the plurality of switches, wherein the logic is to identify whether a product of the first digital number and the second digital number is associated with a positive value or a negative value, during a first clock phase, set a first reference voltage to have a first value or a second value based on whether the product is associated with the positive value or the negative value, during the first clock phase, control the plurality of switches to supply the first reference voltage to the first plates of the plurality of capacitors, and during the first clock phase, control the plurality of switches based on the first digital number to electrically connect at least one of the second plates to the first reference voltage and electrically connect at least one of the second plates to a second reference voltage.

Example 2 includes the computing system of Example 1, wherein the logic is to control the plurality of switches during a second clock phase to electrically connect the first plates to an output, and electrically connect the second plates to the second reference voltage.

Example 3 includes the computing system of Example 2, wherein the logic is to determine that a first capacitor of the plurality of capacitors is associated with a low value of the second digital number, and control the plurality of switches during a third clock phase to electrically connect the first plates to a third reference voltage, and electrically connect the second plate of the first capacitor to the second reference voltage based on the first capacitor being associated with the low value.

Example 4 includes the computing system of Example 3, wherein the logic is to determine that a second capacitor of the plurality of capacitors is associated with a high value of the second digital number, and during the third clock phase, control the plurality of switches to electrically disconnect the second plate of the second capacitor from the second reference voltage based on the second capacitor being associated with the high value.

Example 5 includes the computing system of Example 4, wherein the logic is to control the plurality of switches during a fourth clock phase to electrically connect the first plates to an output, and electrically connect the second plates to the second reference voltage.

Example 6 includes the computing system of any one of Examples 1 to 5, wherein the second reference voltage is a ground voltage, the first digital number is an input associated with a neural network, and the second digital number is a weight associated with the neural network Example 7 includes a semiconductor apparatus comprising one or more substrates, and logic coupled to the one or more substrates, wherein the logic is implemented at least partly in one or more of configurable logic or fixed-functionality logic hardware, the logic coupled to the one or more substrates to identify whether a product of a first digital number and a second digital number is associated with a positive value or a negative value, during a first clock phase, set a first reference voltage to have a first value or a second value based on whether the product is associated with the positive value or the negative value, during the first clock phase, control a plurality of switches to supply the first reference voltage to first plates of a plurality of capacitors, wherein each of the plurality of capacitors includes a respective first plate of the first plates and a second plate, and during the first clock phase, control the plurality of switches based on the first digital number to electrically connect at least one of the second plates to the first reference voltage and electrically connect at least one of the second plates to a second reference voltage.

Example 8 includes the apparatus of Example 7, wherein the logic coupled to the one or more substrates is to control the plurality of switches during a second clock phase to electrically connect the first plates to an output, and electrically connect the second plates to the second reference voltage.

Example 9 includes the apparatus of Example 8, wherein the logic coupled to the one or more substrates is to determine that a first capacitor of the plurality of capacitors is associated with a low value of the second digital number, and control the plurality of switches during a third clock phase to electrically connect the first plates to a third reference voltage, and electrically connect the second plate of the first capacitor to the second reference voltage based on the first capacitor being associated with the low value.

Example 10 includes the apparatus of Example 9, wherein the logic coupled to the one or more substrates is to determine that a second capacitor of the plurality of capacitors is associated with a high value of the second digital number, and during the third clock phase, control the plurality of switches to electrically disconnect the second plate of the second capacitor from the second reference voltage based on the second capacitor being associated with the high value.

Example 11 includes the apparatus of Example 10, wherein the logic coupled to the one or more substrates is to control the plurality of switches during a fourth clock phase to electrically connect the first plates to an output, and electrically connect the second plates to the second reference voltage.

Example 12 includes the apparatus of any one of Examples 7 to 11, wherein the second reference voltage is a ground voltage, the first digital number is an input associated with a neural network, and the second digital number is a weight associated with the neural network Example 13 includes the apparatus of any one of Examples 7 to 12, wherein the logic coupled to the one or more substrates includes transistor channel regions that are positioned within the one or more substrates.

Example 14 includes a method comprising identifying whether a product of a first digital number and a second digital number is associated with a positive value or a negative value, during a first clock phase, setting a first reference voltage to have a first value or a second value based on whether the product is associated with the positive value or the negative value, during the first clock phase, controlling a plurality of switches to supply the first reference voltage to first plates of a plurality of capacitors, wherein each of the plurality of capacitors includes a respective first plate of the first plates and a second plate, and during the first clock phase, controlling the plurality of switches based on the first digital number to electrically connect at least one of the second plates to the first reference voltage and electrically connect at least one of the second plates to a second reference voltage.

Example 15 includes the method of Example 14, further comprising controlling the plurality of switches during a second clock phase to electrically connect the first plates to an output, and electrically connect the second plates to the second reference voltage.

Example 16 includes the method of Example 15, further comprising determining that a first capacitor of the plurality of capacitors is associated with a low value of the second digital number, and controlling the plurality of switches during a third clock phase to electrically connect the first plates to a third reference voltage, and electrically connect the second plate of the first capacitor to the second reference voltage based on the first capacitor being associated with the low value.

Example 17 includes the method of Example 16, further comprising determining that a second capacitor of the plurality of capacitors is associated with a high value of the second digital number, and during the third clock phase, controlling the plurality of switches to electrically disconnect the second plate of the second capacitor from the second reference voltage based on the second capacitor being associated with the high value.

Example 18 includes the method of Example 17, further comprising controlling the plurality of switches during a fourth clock phase to electrically connecting the first plates to an output, and electrically connecting the second plates to the second reference voltage.

Example 19 includes the method of any one of Examples 14 to 18, wherein the second reference voltage is a ground voltage, the first digital number is an input associated with a neural network, and the second digital number is a weight associated with the neural network.

Example 20 includes at least one computer readable storage medium comprising a set of instructions which, when executed by a computing system, cause the computing system to identify whether a product of a first digital number and a second digital number is associated with a positive value or a negative value, during a first clock phase, set a first reference voltage to have a first value or a second value based on whether the product is associated with the positive value or the negative value, during the first clock phase, control a plurality of switches to supply the first reference voltage to first plates of a plurality of capacitors, wherein each of the plurality of capacitors includes a respective first plate of the first plates and a second plate, and during the first clock phase, control the plurality of switches based on the first digital number to electrically connect at least one of the second plates to the first reference voltage and electrically connect at least one of the second plates to a second reference voltage.

Example 21 includes the at least one computer readable storage medium of Example 20, wherein the set of instructions, when executed, cause the computing system to electrically connect the first plates to an output, and electrically connect the second plates to the second reference voltage.

Example 22 includes the at least one computer readable storage medium of Example 21, wherein the set of instructions, when executed, cause the computing system to determine that a first capacitor of the plurality of capacitors is associated with a low value of the second digital number, and control the plurality of switches during a third clock phase to electrically connect the first plates to a third reference voltage, and electrically connect the second plate of the first capacitor to the second reference voltage based on the first capacitor being associated with the low value.

Example 23 includes the at least one computer readable storage medium of Example 22, wherein the set of instructions, when executed, cause the computing system to determine that a second capacitor of the plurality of capacitors is associated with a high value of the second digital number, and during the third clock phase, control the plurality of switches to electrically disconnect the second plate of the second capacitor from the second reference voltage based on the second capacitor being associated with the high value.

Example 24 includes the at least one computer readable storage medium of Example 23, wherein the set of instructions, when executed, cause the computing system to electrically connect the first plates to an output, and electrically connect the second plates to the second reference voltage.

Example 25 includes the at least one computer readable storage medium of any one of Examples 20 to 24, wherein the second reference voltage is a ground voltage, the first digital number is an input associated with a neural network, and the second digital number is a weight associated with the neural network.

Example 26 includes a semiconductor apparatus comprising means for identifying whether a product of a first digital number and a second digital number is associated with a positive value or a negative value, during a first clock phase, means for setting a first reference voltage to have a first value or a second value based on whether the product is associated with the positive value or the negative value, during the first clock phase, means for controlling a plurality of switches to supply the first reference voltage to first plates of a plurality of capacitors, wherein each of the plurality of capacitors includes a respective first plate of the first plates and a second plate, and during the first clock phase, means for controlling the plurality of switches based on the first digital number to electrically connect at least one of the second plates to the first reference voltage and electrically connect at least one of the second plates to a second reference voltage.

Example 27 includes the semiconductor apparatus of Example 26, further comprising means for controlling the plurality of switches during a second clock phase to electrically connect the first plates to an output, and electrically connect the second plates to the second reference voltage.

Example 28 includes the semiconductor apparatus of Example 27, further comprising means for determining that a first capacitor of the plurality of capacitors is associated with a low value of the second digital number, and means for controlling the plurality of switches during a third clock phase to electrically connect the first plates to a third reference voltage, and electrically connect the second plate of the first capacitor to the second reference voltage based on the first capacitor being associated with the low value.

Example 29 includes the semiconductor apparatus of Example 28, further comprising means for determining that a second capacitor of the plurality of capacitors is associated with a high value of the second digital number, and during the third clock phase, means for controlling the plurality of switches to electrically disconnect the second plate of the second capacitor from the second reference voltage based on the second capacitor being associated with the high value.

Example 30 includes the semiconductor apparatus of Example 29, further comprising controlling the plurality of switches during a fourth clock phase to means for electrically connecting the first plates to an output, and means for electrically connecting the second plates to the second reference voltage.

Example 31 includes the semiconductor apparatus of any one of Examples 26 to 30, wherein the second reference voltage is a ground voltage, the first digital number is an input associated with a neural network, and the second digital number is a weight associated with the neural network.

Thus, technology described herein may provide for enhanced in-memory computing architectures. Such embodiments execute with lower latency and power, and at a reduced form factor.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:

a memory array to store a first digital number and a second digital number;

a plurality of capacitors coupled with the memory array, wherein each of the plurality of capacitors includes a first plate and a second plate;

a plurality of switches that selectively couple the plurality of capacitors to a plurality of voltages; and logic that is connected to the plurality of switches, wherein the logic is to:

identify whether a product of the first digital number and the second digital number is associated with a positive value or a negative value;

during a first clock phase, set a first reference voltage to have a first value or a second value based on whether the product is associated with the positive value or the negative value;

during the first clock phase, control the plurality of switches to supply the first reference voltage to the first plates of the plurality of capacitors; and during the first clock phase, control the plurality of switches based on the first digital number to electrically connect at least one of the second plates to the first reference voltage and electrically connect at least one of the second plates to a second reference voltage.

2. The computing system of claim 1, wherein the logic is to control the plurality of switches during a second clock phase to:

electrically connect the first plates to an output; and electrically connect the second plates to the second reference voltage.

3. The computing system of claim 2, wherein the logic is to:

determine that a first capacitor of the plurality of capacitors is associated with a low value of the second digital number; and control the plurality of switches during a third clock phase to:

electrically connect the first plates to a third reference voltage, and electrically connect the second plate of the first capacitor to the second reference voltage based on the first capacitor being associated with the low value.

4. The computing system of claim 3, wherein the logic is to:

determine that a second capacitor of the plurality of capacitors is associated with a high value of the second digital number; and during the third clock phase, control the plurality of switches to electrically disconnect the second plate of the second capacitor from the second reference voltage based on the second capacitor being associated with the high value.

5. The computing system of claim 4, wherein the logic is to control the plurality of switches during a fourth clock phase to:

electrically connect the first plates to an output; and electrically connect the second plates to the second reference voltage.

6. The computing system of claim 1, wherein:

the second reference voltage is a ground voltage;

the first digital number is an input associated with a neural network; and the second digital number is a weight associated with the neural network.

7. A semiconductor apparatus comprising:

one or more substrates; and logic coupled to the one or more substrates, wherein the logic is implemented at least partly in one or more of configurable logic or fixed-functionality logic hardware, the logic coupled to the one or more substrates to:

identify whether a product of a first digital number and a second digital number is associated with a positive value or a negative value;

during a first clock phase, set a first reference voltage to have a first value or a second value based on whether the product is associated with the positive value or the negative value;

during the first clock phase, control a plurality of switches to supply the first reference voltage to first plates of a plurality of capacitors, wherein each of the plurality of capacitors includes a respective first plate of the first plates and a second plate; and during the first clock phase, control the plurality of switches based on the first digital number to electrically connect at least one of the second plates to the first reference voltage and electrically connect at least one of the second plates to a second reference voltage.

8. The apparatus of claim 7, wherein the logic coupled to the one or more substrates is to control the plurality of switches during a second clock phase to:

electrically connect the first plates to an output; and electrically connect the second plates to the second reference voltage.

9. The apparatus of claim 8, wherein the logic coupled to the one or more substrates is to:

determine that a first capacitor of the plurality of capacitors is associated with a low value of the second digital number; and control the plurality of switches during a third clock phase to:

electrically connect the first plates to a third reference voltage, and electrically connect the second plate of the first capacitor to the second reference voltage based on the first capacitor being associated with the low value.

10. The apparatus of claim 9, wherein the logic coupled to the one or more substrates is to:

determine that a second capacitor of the plurality of capacitors is associated with a high value of the second digital number; and during the third clock phase, control the plurality of switches to electrically disconnect the second plate of the second capacitor from the second reference voltage based on the second capacitor being associated with the high value.

11. The apparatus of claim 10, wherein the logic coupled to the one or more substrates is to control the plurality of switches during a fourth clock phase to:

electrically connect the first plates to an output; and electrically connect the second plates to the second reference voltage.

12. The apparatus of claim 7, wherein:

the second reference voltage is a ground voltage;

the first digital number is an input associated with a neural network; and the second digital number is a weight associated with the neural network.

13. The apparatus of claim 7, wherein the logic coupled to the one or more substrates includes transistor channel regions that are positioned within the one or more substrates.

14. A method comprising:

identifying whether a product of a first digital number and a second digital number is associated with a positive value or a negative value;

during a first clock phase, setting a first reference voltage to have a first value or a second value based on whether the product is associated with the positive value or the negative value;

during the first clock phase, controlling a plurality of switches to supply the first reference voltage to first plates of a plurality of capacitors, wherein each of the plurality of capacitors includes a respective first plate of the first plates and a second plate; and during the first clock phase, controlling the plurality of switches based on the first digital number to electrically connect at least one of the second plates to the first reference voltage and electrically connect at least one of the second plates to a second reference voltage.

15. The method of claim 14, further comprising controlling the plurality of switches during a second clock phase to:

electrically connect the first plates to an output; and electrically connect the second plates to the second reference voltage.

16. The method of claim 15, further comprising:

determining that a first capacitor of the plurality of capacitors is associated with a low value of the second digital number; and controlling the plurality of switches during a third clock phase to:

electrically connect the first plates to a third reference voltage, and electrically connect the second plate of the first capacitor to the second reference voltage based on the first capacitor being associated with the low value.

17. The method of claim 16, further comprising:

determining that a second capacitor of the plurality of capacitors is associated with a high value of the second digital number; and during the third clock phase, controlling the plurality of switches to electrically disconnect the second plate of the second capacitor from the second reference voltage based on the second capacitor being associated with the high value.

18. The method of claim 17, further comprising controlling the plurality of switches during a fourth clock phase to:

electrically connecting the first plates to an output; and electrically connecting the second plates to the second reference voltage.

19. The method of claim 14, wherein:

the second reference voltage is a ground voltage;

the first digital number is an input associated with a neural network; and the second digital number is a weight associated with the neural network.

20. At least one computer readable storage medium comprising a set of instructions which, when executed by a computing system, cause the computing system to:

identify whether a product of a first digital number and a second digital number is associated with a positive value or a negative value;

during a first clock phase, set a first reference voltage to have a first value or a second value based on whether the product is associated with the positive value or the negative value;

during the first clock phase, control a plurality of switches to supply the first reference voltage to first plates of a plurality of capacitors, wherein each of the plurality of capacitors includes a respective first plate of the first plates and a second plate; and during the first clock phase, control the plurality of switches based on the first digital number to electrically connect at least one of the second plates to the first reference voltage and electrically connect at least one of the second plates to a second reference voltage.

21. The at least one computer readable storage medium of claim 20, wherein the set of instructions, when executed, cause the computing system to:

electrically connect the first plates to an output; and electrically connect the second plates to the second reference voltage.

22. The at least one computer readable storage medium of claim 21, wherein the set of instructions, when executed, cause the computing system to:

determine that a first capacitor of the plurality of capacitors is associated with a low value of the second digital number; and control the plurality of switches during a third clock phase to:

electrically connect the first plates to a third reference voltage, and electrically connect the second plate of the first capacitor to the second reference voltage based on the first capacitor being associated with the low value.

23. The at least one computer readable storage medium of claim 22, wherein the set of instructions, when executed, cause the computing system to:

determine that a second capacitor of the plurality of capacitors is associated with a high value of the second digital number; and during the third clock phase, control the plurality of switches to electrically disconnect the second plate of the second capacitor from the second reference voltage based on the second capacitor being associated with the high value.

24. The at least one computer readable storage medium of claim 23, wherein the set of instructions, when executed, cause the computing system to:

electrically connect the first plates to an output; and electrically connect the second plates to the second reference voltage.

25. The at least one computer readable storage medium of claim 20, wherein the second reference voltage is a ground voltage;

the first digital number is an input associated with a neural network; and the second digital number is a weight associated with the neural network.

* * * * *